US010855271B2

(12) United States Patent
Imasato et al.

(10) Patent No.: US 10,855,271 B2
(45) Date of Patent: Dec. 1, 2020

(54) CONTROL DEVICE FOR SEMICONDUCTOR SWITCH, AND ELECTRICAL POWER SYSTEM

(71) Applicant: SANYO Electric Co., Ltd., Daito (JP)

(72) Inventors: Takashi Imasato, Hyogo (JP); Hideyuki Sasao, Hyogo (JP)

(73) Assignee: SANYO Electric Co., Ltd., Daito (JP)

( * ) Notice: Subject to any disclaimer, the term of this patent is extended or adjusted under 35 U.S.C. 154(b) by 44 days.

(21) Appl. No.: 16/462,667

(22) PCT Filed: Nov. 22, 2017

(86) PCT No.: PCT/JP2017/041975
§ 371 (c)(1),
(2) Date: May 21, 2019

(87) PCT Pub. No.: WO2018/110230
PCT Pub. Date: Jun. 21, 2018

(65) Prior Publication Data
US 2020/0083881 A1 Mar. 12, 2020

(30) Foreign Application Priority Data
Dec. 15, 2016 (JP) .................. 2016-243780

(51) Int. Cl.
H03K 17/16 (2006.01)
H02H 9/00 (2006.01)
B60R 16/03 (2006.01)

(52) U.S. Cl.
CPC ........... *H03K 17/164* (2013.01); *B60R 16/03* (2013.01); *H02H 9/001* (2013.01)

(58) Field of Classification Search
CPC ....... H03K 17/164; B60R 16/03; H02H 9/001
(Continued)

(56) References Cited

U.S. PATENT DOCUMENTS 10,056,894 B2 * 8/2018 Chen .................. H03K 17/0406
2016/0257270 A1 9/2016 Teramoto et al.

FOREIGN PATENT DOCUMENTS

JP 2-63213 A 3/1990
JP 2011-178384 A 9/2011
(Continued)

OTHER PUBLICATIONS

International Search Report dated Feb. 13, 2018, issued in counterpart International Application No. PCT/JP2017/041975 (1 page).

Primary Examiner — Metasebia T Retebo
(74) Attorney, Agent, or Firm — Westerman, Hattori, Daniels & Adrian, LLP

(57) ABSTRACT

In a control device that drives a semiconductor switch element, a first control switch is connected between a signal line and a source terminal or an emitter terminal of a semiconductor switch element. The signal line supplies a driving signal to a gate terminal or a base terminal of semiconductor switch element. The first control switch is controlled to an ON state when the semiconductor switch element is controlled to an OFF state. A second control switch is connected between the signal line and the source terminal or the emitter terminal in parallel with the first control switch. The second control switch is turned on when a potential of the source terminal or the emitter terminal becomes a negative potential.

10 Claims, 4 Drawing Sheets

(58) Field of Classification Search
USPC .......................................................... 307/10.1
See application file for complete search history.

(56) References Cited

FOREIGN PATENT DOCUMENTS

| | | |
|---|---|---|
| JP | 2016-164015 A | 9/2016 |
| WO | 2015/189982 A1 | 12/2015 |
| WO | 2017/086113 A1 | 5/2017 |

* cited by examiner

CONTROL DEVICE FOR SEMICONDUCTOR SWITCH, AND ELECTRICAL POWER SYSTEM

TECHNICAL FIELD

The present invention relates to a control device for a semiconductor switch, and an electrical power system that are equipped in a vehicle.

BACKGROUND ART

Nowadays, vehicles are equipped with auxiliary batteries (normally, lead storage batteries), and such auxiliary batteries supply electric power to starter motors and various electric devices. A mechanical relay is generally used for a switch for turning on or off the auxiliary battery. Recently, there have been attempts to use a semiconductor switch (for example, a metal-oxide-semiconductor field-effect transistor (MOSFET)) that is less noisy than the mechanical relay. A parasitic diode exists in the MOSFET, and therefore in order to use the MOSFET as a bidirectional switch, two MOSFETs need to be connected in series and in reverse to each other (see, for example, PTL 1).

In general, control to turn on or off the MOSFET is performed by inputting a driving signal to a gate of the MOSFET and turning on or off a control switch that is provided between the gate and a source of the MOSFET. The control switch is configured, for example, by a PNP transistor in which an emitter is connected to the gate of the MOSFET and a collector is connected to the source of the MOSFET.

CITATION LIST

Patent Literature

PTL 1: Unexamined Japanese Patent Publication No. 2016-164015

SUMMARY OF THE INVENTION

When a bidirectional switch is turned off in a state where a large current is flowing through two MOSFETs that configure the bidirectional switch, a potential of the bidirectional switch momentarily swings to a negative potential due to an inductance component of an electric wire that is caused by a change in a current, in some cases.

In a case where a switch that controls each of the MOSFETs is configured by a PNP transistor, as described above, the MOSFET is controlled to be turned on or off on the basis of whether a base of the PNP transistor is made conductive with a ground. In this configuration, an emitter potential of the PNP transistor (namely, a gate potential of the MOSFET) is assumed to be a positive potential.

In turning off the bidirectional switch, in a case where the gate potential of the bidirectional switch swings to a negative potential, the PNP transistors are turned off in the middle of turning off the bidirectional switch. This causes an operation of the bidirectional switch to stop in a half-ON state, an ON-resistance of each of the MOSFETs remains high, and conduction loss increases. In a case where each of the MOSFETs has low specifications, a failure is caused in some cases.

The present invention has been developed in view of the situation described above. It is an object of the present invention to provide a technology for preventing an operation from stopping in the middle of turning off a semiconductor switch that shuts down a large current.

In order to solve the problem described above, a control device for a semiconductor switch in an aspect of the present invention is a control device that drives a semiconductor switch element. The control device includes: a first control switch that is connected between a signal line and a source terminal or an emitter terminal of the semiconductor switch element, the signal line supplying a driving signal to a gate terminal or a base terminal of the semiconductor switch element, the first control switch being controlled to an OFF state when the semiconductor switch element is controlled to an ON state, and being controlled to the ON state when the semiconductor switch element is controlled to the OFF state; and a second control switch that is connected between the signal line and the source terminal or the emitter terminal of the semiconductor switch element in parallel with the first control switch, the second control switch being turned on when a potential of the source terminal or the emitter terminal becomes a negative potential.

Any desired combinations of the configuration elements described above and converted expressions of the present invention in methods, devices, systems, and other similar entities are still effective as aspects of the present invention.

According to the present invention, an operation can be prevented from stopping in the middle of turning off a semiconductor switch that shuts down a large current.

DESCRIPTION OF EMBODIMENT

Figure 1:
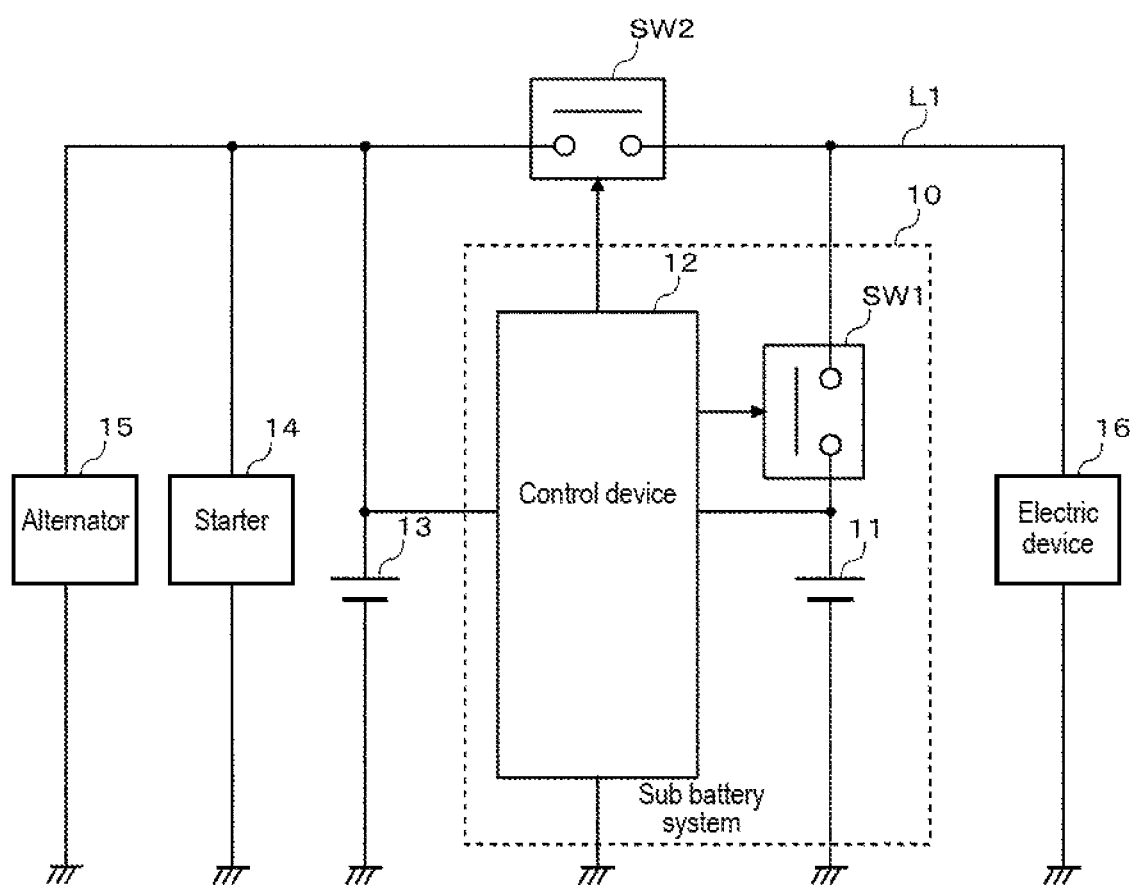
FIG. 1 is a diagram for describing a vehicle electrical power system according to an exemplary embodiment of the present invention.

FIG. 1 is a diagram for describing a vehicle electrical power system according to an exemplary embodiment of the present invention. The vehicle electrical power system includes lead storage battery 13 and sub battery system 10 that supplements lead storage battery 13. A vehicle equipped with lead storage battery 13 and sub battery system 10 is equipped with starter 14, alternator 15, and electric device 16 as components associated with lead storage battery 13 and sub battery system 10.

Starter 14 is a motor for starting an engine. Starter 14 rotates due to power supplied from lead storage battery 13 so as to start the engine. When an ignition switch (not illustrated) is turned on according to an operation performed by a driver, power is supplied from lead storage battery 13 through power supply line L1 to starter 14, and thus, starter 14 is started. Alternator 15 generates power due to rotational energy of a crankshaft of the engine. Alternator 15 supplies the generated power to lead storage battery 13 and/or sub battery system 10 through power supply line L1.

Electric device 16 is a general term that indicates various electric loads (auxiliaries) equipped in the vehicle, such as headlights, power steering, an oil pump, a car navigation system, or audio equipment. Herein, starter 14 and alternator 15 are illustrated separately from electric device 16 for convenience of description. Electric device 16 is driven with the power supplied from lead storage battery 13 and/or sub battery system 10 through power supply line L1.

Lead storage battery 13 is a main battery that stores the power generated by alternator 15 and supplies the power to starter 14 and electric device 16. Sub battery system 10 includes nickel-hydrogen storage battery 11, control device 12, and first switch device SW1. Nickel-hydrogen storage battery 11 is a sub battery that stores the power generated by alternator 15 and supplies the power to electric device 16. Nickel-hydrogen storage battery 11 is designed to have a capacity smaller than a capacity of lead storage battery 13. Lead storage battery 13 and nickel-hydrogen storage battery 11 are connected in parallel.

Lead storage battery 13 has beneficial features such as being relatively inexpensive, being operable in a relatively wide temperature range, or having a high output, and thus has been widely used as a storage battery for vehicles. However, lead storage battery 13 has disadvantages of having low energy efficiency upon charging and discharging, being less resistant to overdischarge, or having a short cycle life. Nickel-hydrogen storage battery 11 has beneficial features such as having relatively high energy efficiency upon charging and discharging, being resistant to overcharge and overdischarge, being operable in a wide temperature range, having a wide state of charge (SOC) range, or having a relatively long cycle life.

Note that a lithium ion storage battery may be used in place of nickel-hydrogen storage battery 11. The lithium ion storage battery is a high-performance storage battery having high energy density and high energy efficiency upon charging and discharging. However, the lithium ion storage battery needs to have tight voltage and temperature control. In place of nickel-hydrogen storage battery 11, a capacitor such as an electric double layer capacitor or a lithium ion capacitor may be used.

First switch device SW1 is inserted between a positive electrode of nickel-hydrogen storage battery 11 and power supply line L1. Second switch device SW2 is inserted between a node of power supply line L1 closer to lead storage battery 13 and a node of power supply line L1 closer to nickel-hydrogen storage battery 11.

Control device 12 manages the state of nickel-hydrogen storage battery 11 by monitoring a voltage, a current, and temperature of nickel-hydrogen storage battery 11, and controls charging and discharging of nickel-hydrogen storage battery 11. Specifically, control device 12 manages an SOC and a state of health (SOD of nickel-hydrogen storage battery 11 based on a voltage, a current, and temperature. In addition, when control device 12 detects overvoltage, undervoltage, overcurrent, or an abnormality in temperature, control device 12 turns off first switch device SW1 so as to stop charging and discharging. When control device 12 desires to electrically disconnect lead storage battery 13 from nickel-hydrogen storage battery 11, control device 12 turns off second switch device SW2 to disconnect lead storage battery 13 and nickel-hydrogen storage battery 11 from each other.

A bidirectional current flows through first switch device SW1 and second switch device SW2, and therefore, a mechanical relay has been generally used. However, the mechanical relay has a physical contact, and therefore, noise is generated upon switching. Accordingly, an attempt has been made to use a semiconductor switch in which two MOSFETs are connected in series. In the exemplary embodiment illustrated in FIG. 1 or the like, a bidirectional current is assumed to flow through first switch device SW1 and second switch device SW2. However, in some cases, a current only flows in a single direction depending on a configuration of an exemplary embodiment. In such an exemplary embodiment, a configuration may be employed in which only a semiconductor switch that corresponds to a direction of a flowing current is provided.

Figure 2:
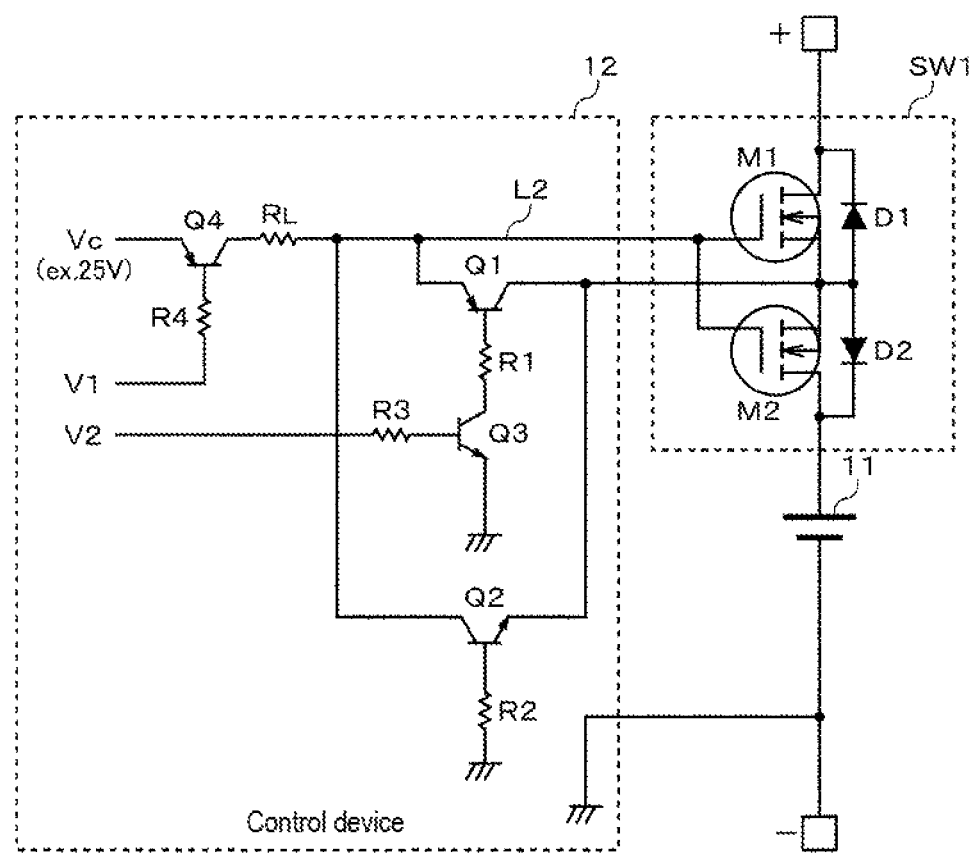
FIG. 2 is a diagram illustrating Configuration Example 1 of a sub battery system using a semiconductor switch.

FIG. 2 is a diagram illustrating Configuration Example 1 of sub battery system 10 using a semiconductor switch. Configuration Example 1 is an example in which an n-channel MOSFET is used. First current shutdown switch M1 and second current shutdown switch M2 are configured by two n-channel MOSFETs that are connected in series.

A source terminal of first current shutdown switch M1 and a source terminal of second current shutdown switch M2 are connected to each other, a drain terminal of first current shutdown switch M1 is connected to power supply line L1, and a drain terminal of second current shutdown switch M2 is connected to a positive electrode terminal of nickel-hydrogen storage battery 11. A gate terminal of first current shutdown switch M1 and a gate terminal of second current shutdown switch M2 are commonly connected to gate signal line L2. First parasitic diode D1 is formed between a source and a drain of first current shutdown switch M1, and second parasitic diode D2 is formed between a source and a drain of second current shutdown switch M2. A parasitic diode is generated in a MOSFET and therefore only a single-directional current can be shut down by using a single MOSFET. Accordingly, a bidirectional switch is configured by connecting two MOSFETs in series and in reverse to each other. Hereinafter, assume an example in which n-channel MOSFETs having a threshold voltage of 4 V are used.

A negative electrode terminal of nickel-hydrogen storage battery 11 and a ground terminal of control device 12 are connected to a chassis of a vehicle in a non-insulated state. In general, an auxiliary battery of a vehicle is connected to a chassis. Moreover, a high-voltage traction battery is installed while being electrically insulated from the chassis.

In FIG. 2, only configuration elements relating to the driving of first current shutdown switch M1 and second current shutdown switch M2 are illustrated in a block of control device 12. Prescribed constant voltage Vc is applied to gate signal line L2. In the present configuration example, it is assumed that a voltage of nickel-hydrogen storage battery 11 is 12 V and threshold voltages of first current shutdown switch M1 and second current shutdown switch M2 are 4 V. A voltage of gate signal line L2 needs to be set to a voltage that is sufficiently larger than 12 V. In the present configuration example, a case is assumed where the voltage of gate signal line L2 is set to 25 V. Constant voltage Vc of 25 V is generated by boosting a voltage of nickel-hydrogen storage battery 11 or lead storage battery 13 by using a direct-current (DC)/DC converter (not illustrated). Resistor $R_L$ indicates a resistor for limiting a current of gate signal line L2. If a current does not need to be limited, resistor $R_L$ may be omitted.

Control device 12 includes first control switch Q1, second control switch Q2, third control switch Q3, and fourth control switch Q4. In the present configuration example, a PNP bipolar transistor is used for first control switch Q1, an NPN bipolar transistor is used for second control switch Q2, an NPN bipolar transistor is used for third control switch Q3, and a PNP bipolar transistor is used for fourth control switch Q4.

An emitter terminal of first control switch Q1 is connected to gate signal line L2, a collector terminal of first control switch Q1 is connected to a common source terminal of first current shutdown switch M1 and second current shutdown switch M2, and a base terminal of first control switch Q1 is connected to a collector terminal of third control switch Q3 via first resistor R1.

An emitter terminal of second control switch Q2 is connected to the common source terminal of first current shutdown switch M1 and second current shutdown switch M2, a collector terminal of second control switch Q2 is connected to gate signal line L2, and a base terminal of second control switch Q2 is connected to a ground via second resistor R2. First control switch Q1 and second control switch Q2 have a parallel connection relationship.

An emitter terminal of third control switch Q3 is connected to a ground, and a base terminal of third control switch Q3 is connected to an input source of second control signal V2 via third resistor R3. Fourth control switch Q4 is inserted into gate signal line L2. An emitter terminal of fourth control switch Q4 is connected to a generation source of constant voltage Vc, and a base terminal of fourth control switch Q4 is connected to an input source of first control signal V1 via fourth resistor R4. A collector terminal of fourth control switch Q4 is connected via resistor $R_L$ to the gate terminals of first current shutdown switch M1 and second current shutdown switch M2, the emitter terminal of first control switch Q1, and the collector terminal of second control switch Q2.

The input sources of first control signal V1 and second control signal V2 are configured by a microcomputer (not illustrated). The microcomputer determines levels of first control signal V1 and second control signal V2 in accordance with an instruction from an electronic control unit (ECU) on a vehicle side and the occurrence or non-occurrence of abnormality in nickel-hydrogen storage battery 11.

When a bidirectional switch configured by first current shutdown switch M1 and second current shutdown switch M2 is controlled to an ON state, the microcomputer controls first control signal V1 to a low level, and controls second control signal V2 to the low level. By doing this, fourth control switch Q4 is controlled to the ON state, third control switch Q3 is controlled to an OFF state, first control switch Q1 is controlled to the OFF state, and constant voltage Vc (25 V) is applied to the gate terminals of first current shutdown switch M1 and second current shutdown switch M2. By doing this, electric charges are charged to a parasitic capacitance between a gate and a source, an ON-resistance decreases, and a drain is made conductive with the source.

In contrast, when the bidirectional switch configured by first current shutdown switch M1 and second current shutdown switch M2 is controlled to the OFF state, the microcomputer controls first control signal V1 to a high level, and controls second control signal V2 to the high level. By doing this, fourth control switch Q4 is controlled to the OFF state, third control switch Q3 is controlled to the ON state, first control switch Q1 is controlled to the ON state, and in first current shutdown switch M1 and second current shutdown switch M2, the gate and the source are short-circuited via first control switch Q1. Through this route, the electric charges that have been charged to the parasitic capacitance between the gate and the source are quickly discharged, the ON-resistance increases, and the drain and the source are disconnected from each other.

The microcomputer may be implemented in a substrate of control device 12, or may be implemented in another substrate. In addition, first control signal V1 and second control signal V2 may be generated in a hardware circuit in place of the microcomputer. In FIG. 2, each of the bipolar transistors is illustrated to be open between an emitter and a base, but in practice, it is preferable that the emitter and the base be connected via a resistor or the like. In this case, even if the base is opened, the transistor can maintain the OFF state.

A case is examined where, in the circuit configuration described above, first current shutdown switch M1 and second current shutdown switch M2 are turned off so that a current is shut down, from a state where nickel-hydrogen storage battery 11 is performing large-current charging and discharging (first current shutdown switch M1 and second current shutdown switch M2 are in the ON state). By performing the control described above, fourth control switch Q4 is switched from the ON state to the OFF state, third control switch Q3 is switched from the OFF state to the ON state, and first control switch Q1 is switched from the OFF state to the ON state.

By performing the control described above, the gate and the source are short-circuited in each of first current shutdown switch M1 and second current shutdown switch M2, and then discharging of the parasitic capacitance between the gate and the source is advanced. When a voltage between the gate and the source decreases so as to be lower than the threshold voltage (4 V), first current shutdown switch M1 and second current shutdown switch M2 start to be turned off. At this moment, a current flowing between the drain and the source is sharply reduced, and in some cases, potentials of first current shutdown switch M1 and second current shutdown switch M2 swing to a negative potential (a negative surge is generated) due to an inductance component of an electric wire (a wire harness) that makes an attempt to maintain the current flowing between the drain and the source.

For example, when potentials of the source terminals of first current shutdown switch M1 and second current shutdown switch M2 swing to −20 V, a potential of gate signal line L2 is changed to −16 V because electric charges that correspond to the threshold voltage (4 V) remain in the parasitic capacitance between the gate and the source. First control switch Q1 maintains the ON state by drawing a current from the base terminal to the ground. Therefore, when the emitter terminal comes to have a negative potential, first control switch Q1 fails to maintain the ON state, and is turned off.

In a conventional configuration in which second control switch Q2 is not provided, when first control switch Q1 enters into the OFF state, an operation to turn off first current shutdown switch M1 and second current shutdown switch M2 stops in the half-ON state in which the electric charges that correspond to the threshold voltage (4 V) remain in the parasitic capacitance between the gate and the source. In this state, the ON-resistance remains high, and conduction loss increases. In a case where the MOSFETs have low specifications, a failure is caused in some cases.

Accordingly, in the present configuration example, second control switch Q2 is added in parallel with first control switch Q1. When potentials of the source terminals of first current shutdown switch M1 and second current shutdown switch M2 become negative potentials, second control switch Q2 is automatically turned on. The negative electrode terminal of nickel-hydrogen storage battery 11 and the ground terminal of control device 12 are electrically connected via the chassis, and therefore a current can be made to flow from the ground terminal of control device 12 to the base terminal of second control switch Q2. By doing this, the electric changes that remain in the parasitic capacitance between the gate and the source in first current shutdown switch M1 and second current shutdown switch M2 and that correspond to the threshold voltage (4 V) can continue to be discharged, and first current shutdown switch M1 and second current shutdown switch M2 can be turned off rapidly and completely.

Figure 3:
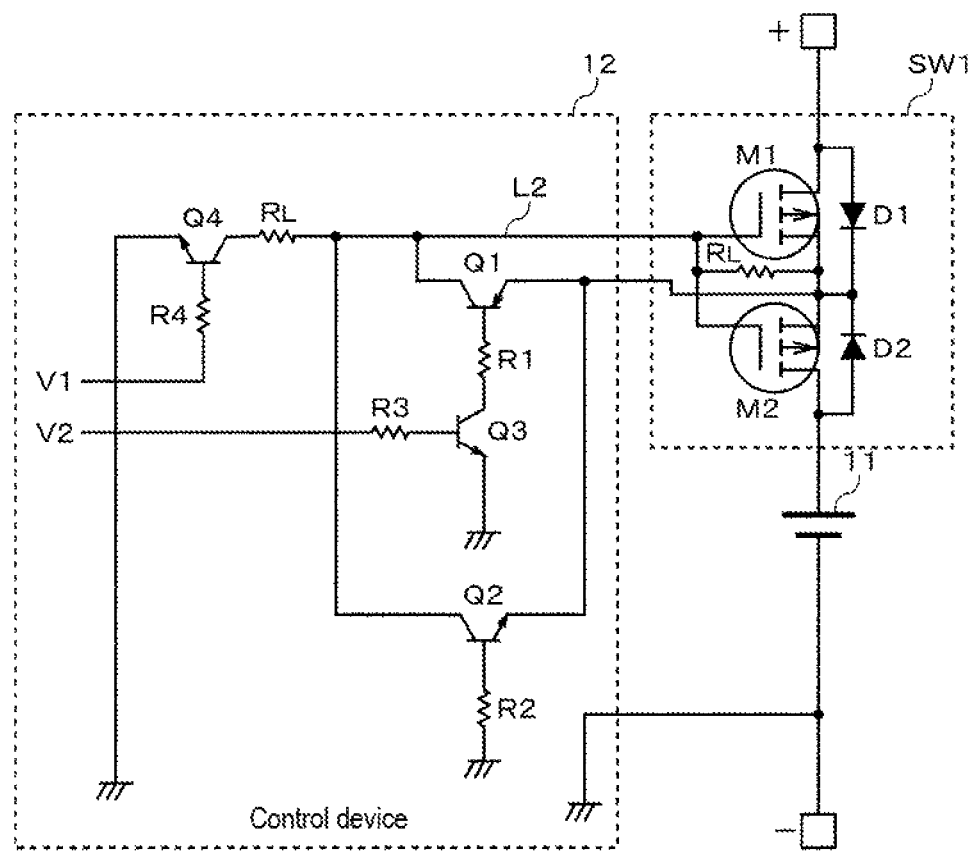
FIG. 3 is a diagram illustrating Configuration Example 2 of a sub battery system using a semiconductor switch.

FIG. 3 is a diagram illustrating Configuration Example 2 of sub battery system 10 using a semiconductor switch. Configuration Example 2 is an example in which a p-channel MOSFET is used. First current shutdown switch M1 and second current shutdown switch M2 are configured by two p-channel MOSFETs that are connected in series.

In Configuration Example 2, a voltage of gate signal line L2 needs to be set to a voltage that is sufficiently smaller than 12 V. In the present configuration example, a case is assumed where the voltage of gate signal line L2 is set to a ground voltage. In Configuration Example 2, an NPN bipolar transistor is used for fourth control switch Q4. In addition, a connection relationship of an emitter terminal and a connector terminal of first control switch Q1 is reversed, the emitter terminal of first control switch Q1 is connected to a common source terminal of first current shutdown switch M1 and second current shutdown switch M2, and the collector terminal of first control switch Q1 is connected to gate signal line L2.

An emitter terminal of fourth control switch Q4 is connected to a ground, and a base terminal of fourth control switch Q4 is connected to an input source of first control signal V1 via fourth resistor R4. A collector terminal of fourth control switch Q4 is connected via resistor $R_L$ to gate terminals of first current shutdown switch M1 and second current shutdown switch M2, the collector terminal of first control switch Q1, and a collector terminal of second control switch Q2n.

When a bidirectional switch configured by first current shutdown switch M1 and second current shutdown switch M2 is controlled to the ON state, the microcomputer described above controls first control signal V1 to the high level, and controls second control signal V2 to the low level. By doing this, fourth control switch Q4 is controlled to the ON state, third control switch Q3 is controlled to the OFF state, first control switch Q1 is controlled to the OFF state, and the ground voltage is applied to the gate terminals of first current shutdown switch M1 and second current shutdown switch M2. By doing this, electric charges are charged to a parasitic capacitance between a gate and a source, an ON-resistance decreases, and a drain is made conductive with the source.

In contrast, when the bidirectional switch configured by first current shutdown switch M1 and second current shutdown switch M2 is controlled to the OFF state, the microcomputer controls first control signal V1 to the low level, and controls second control signal V2 to the high level. By doing this, fourth control switch Q4 is controlled to the OFF state, third control switch Q3 is controlled to the ON state, first control switch is controlled to the ON state, and in first current shutdown switch M1 and second current shutdown switch M2, the gate and the source are short-circuited via first control switch Q1. Through this route, the electric charges that have been charged to the parasitic capacitance between the gate and the source are quickly discharged, the ON-resistance increases, and the drain and the source are disconnected from each other.

Similarly in Configuration Example 2, second control switch Q2 is added in parallel with first control switch Q1. When potentials of the source terminals of first current shutdown switch M1 and second current shutdown switch M2 become negative potentials, second control switch Q2 is automatically turned on. By doing this, the electric changes that remain in the parasitic capacitance between the gate and the source in first current shutdown switch M1 and second current shutdown switch M2 and that correspond to the threshold voltage (4 V) can continue to be discharged, and first current shutdown switch M1 and second current shutdown switch M2 can be turned off rapidly and completely.

As described above, in the present exemplary embodiment, first control switch Q1 and second control switch Q2 are provided. First control switch Q1 operates when gate potentials of first current shutdown switch M1 and second current shutdown switch M2 are positive potentials. Second control switch Q2 operates when the gate potentials of first current shutdown switch M1 and second current shutdown switch M2 are negative potentials. By doing this, an operation can be prevented from stopping in the middle of turning off first current shutdown switch M1 and second current shutdown switch M2. Accordingly, an increase in conduction loss can be suppressed, and a failure in MOSFETs can be prevented.

The present invention has been described above based on the exemplary embodiment. The exemplary embodiment is intended to be illustrative only, and the person of ordinary skill in the art will understand that various modified examples are possible for a combination of respective configuration elements and respective processing processes in the exemplary embodiment and that such modified examples also fall within the scope of the present invention.

Figure 4:
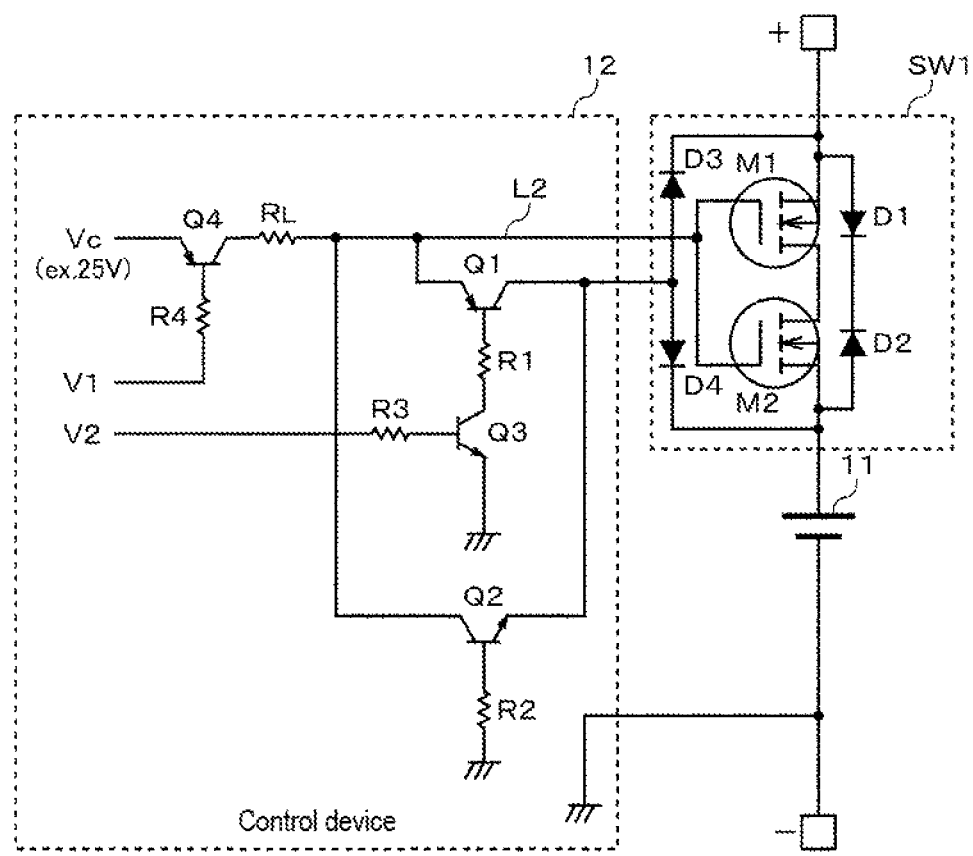
FIG. 4 is a diagram illustrating a modified example of Configuration Example 1 of FIG. 2.

FIG. 4 is a diagram illustrating a modified example of Configuration Example 1 of FIG. 2. As illustrated in FIG. 4, an order of connection of first current shutdown switch M1 and second current shutdown switch M2 may be changed. Stated another way, a form may be employed in which drains of n-channel MOSFETs are connected to each other. In this case, third diode D3 is inserted between gate signal line L2 and the source terminal of first current shutdown switch M1, and fourth diode D4 is inserted between gate signal line L2 and the source terminal of second current shutdown switch M2. Similarly to Configuration Example 1, the order illustrated in FIG. 3 of connection of first current shutdown switch M1 and second current shutdown switch M2 may be changed.

In the exemplary embodiment described above, at least one of first control switch Q1 to fourth control switch Q4 may be replaced with a field-effect transistor (FET). An NPN transistor can be replaced with an n-channel FET, and a PNP transistor can be replaced with a p-channel FET. With respect to first control switch Q1, a potential difference between the gate and the source can be brought closer to zero by using the PNP transistor than by using the p-channel FET.

In addition, an insulated gate bipolar transistor (IGBT) may be used for first current shutdown switch M1 and second current shutdown switch M2. In this case, a voltage between a gate and an emitter of the IGBT is controlled by first control switch Q1 and second control switch Q2. A bipolar transistor can also be used for first current shutdown switch M1 and second current shutdown switch M2, although conduction loss increases in comparison with a case where an FET is used. In this case, a base current of the bipolar transistor is controlled by first control switch Q1 and second control switch Q2.

In the exemplary embodiment described above, an example has been described in which a bidirectional switch in which first current shutdown switch M1 and second current shutdown switch M2 are connected in series and a control device that controls the bidirectional switch are used to control an auxiliary battery to be turned on or off. In this respect, the control device described above is applicable to any circuit configuration in which the bidirectional switch is used to shut down a large current and a ground of a main circuit including the bidirectional switch and a ground of the control device are commonly connected in a non-insulated state.

The exemplary embodiment may be specified by items described below.

[Item 1]

Control device (12) for a semiconductor switch, control device (12) driving semiconductor switch element (M1), control device (12) including:

first control switch (Q1) that is connected between signal line (L2) and a source terminal or an emitter terminal of semiconductor switch element (M1), signal line (L2) supplying a driving signal to a gate terminal or a base terminal of semiconductor switch element (M1), first control switch (Q1) being controlled to an OFF state when semiconductor switch element (M1) is controlled to an ON state, and being controlled to the ON state when semiconductor switch element (M1) is controlled to the OFF state; and second control switch (Q2) that is connected between the signal line and the source terminal or the emitter terminal in parallel with first control switch (Q1), second control switch (Q2) being turned on when a potential of the source terminal or the emitter terminal becomes a negative potential.

By employing this, in turning off the semiconductor switch, the potential of the source terminal or the emitter terminal becomes a negative potential, and therefore a turning-off operation can be prevented from stopping in the middle of the operation.

[Item 2]

Control device (12) for a semiconductor switch, control device (12) driving a bidirectional switch that includes first semiconductor switch element (M1) and second semiconductor switch element (M2) that are connected in series and in reverse to each other, control device (12) including:

first control switch (Q1) that is connected between signal line (L2) and a middle point or both ends of first semiconductor switch element (M1) and second semiconductor switch element (M2), signal line (L2) supplying a driving signal to control terminals of first semiconductor switch element (M1) and the second semiconductor switch element (M2), first control switch (Q1) being controlled to an OFF state when the bidirectional switch is controlled to an ON state, and being controlled to the ON state when the bidirectional switch is controlled to the OFF state; and second control switch (Q2) that is connected between the signal line and the middle point or both the ends in parallel with first control switch (Q1), second control switch (Q2) being turned on when a potential of the middle point or both the ends becomes a negative potential.

By employing this, in turning off the bidirectional switch, the potential of the middle point or both the ends becomes a negative potential, and therefore a turning-off operation can be prevented from stopping in the middle of the operation.

[Item 3]

Control device (12) for the semiconductor switch described in item 2, in which first semiconductor switch element (M1) and second semiconductor switch element (M2) include n-channel field-effect transistors (FETs), first control switch (Q1) includes a PNP transistor that includes an emitter terminal connected to signal line (L2), a base terminal connected to a ground via third control switch (Q3), and a collector terminal connected to a source terminal of first semiconductor switch element (M1) and a source terminal of second semiconductor switch element (M2), and second control switch (Q2) includes an NPN transistor that includes an emitter terminal connected to the source terminal of first semiconductor switch element (M1) and the source terminal of second semiconductor switch element (M2), a base terminal connected to the ground, and a collector terminal connected to signal line (L2).

By employing this, in turning off the bidirectional switch, when potentials of the source terminal of first semiconductor switch element (M1) and the source terminal of second semiconductor switch element (M2) become negative potentials, second control switch (Q2) is automatically turned on, and therefore an operation to turn off the bidirectional switch can be prevented from stopping in the middle of the operation.

[Item 4]

Control device (12) for the semiconductor switch described in item 2, in which first semiconductor switch element (M1) and second semiconductor switch element (M2) include p-channel FETs, first control switch (Q1) includes a PNP transistor that includes an emitter terminal connected to a source terminal of first semiconductor switch element (I1) and a source terminal of second semiconductor switch element (M2), a base terminal connected to a ground via third control switch (Q3), and a collector terminal connected to signal line (L2), and second control switch (Q2) includes an NPN transistor that includes an emitter terminal connected to the source terminal of first semiconductor switch element (M1) and the source terminal of second semiconductor switch element (M2), a base terminal connected to the ground, and a collector terminal connected to signal line (L2).

By employing this, in turning off the bidirectional switch, when potentials of the source terminal of first semiconductor switch element (M1) and the source terminal of second semiconductor switch element (M2) become negative potentials, second control switch (Q2) is automatically turned on, and therefore an operation to turn off the bidirectional switch can be prevented from stopping in the middle of the operation.

[Item 5]

Electrical power system (10) including:

power storage (11) that supplies power to load (16) in a vehicle;

a bidirectional switch that is connected between power storage (11) and load (16), the bidirectional switch including first semiconductor switch element (M1) and second semiconductor switch element (M2) that are connected in series and in reverse to each other; and control device (12) described in any of items 2 to 4 that controls the bidirectional switch.

By employing this, in turning off the bidirectional switch, the potential of the middle point or both the ends becomes a negative potential, and therefore a turning-off operation can be prevented from stopping in the middle of the operation, and electrical power system (10) having high reliability can be constructed.

[Item 6]

Electrical power system (10) described in item 5, in which a ground of power storage (11) and a ground of control device (12) are connected to a chassis of the vehicle in a non-insulated state.

By employing this, in turning off the bidirectional switch, when the potential of the middle point or both the ends becomes a negative potential, a closed loop via second control switch (Q2) can be formed.

The invention claimed is:

1. A control device for a semiconductor switch, the control device driving a semiconductor switch element, the control device comprising:
   a first control switch that is connected between a signal line and a source terminal or an emitter terminal of the semiconductor switch element, the signal line supplying a driving signal to a gate terminal or a base terminal of the semiconductor switch element, the first control switch being controlled to an OFF state when the semiconductor switch element is controlled to an ON state, and being controlled to the ON state when the semiconductor switch element is controlled to the OFF state; and
   a second control switch that is connected between the signal line and the source terminal or the emitter terminal of the semiconductor switch element in parallel with the first control switch, the second control switch being turned on when a potential of the source terminal or the emitter terminal becomes a negative potential.

2. A control device for a semiconductor switch, the control device driving a bidirectional switch that includes a first semiconductor switch element and a second semiconductor switch element that are connected in series and in reverse to each other, the control device comprising:
   a first control switch that is connected between a signal line and a middle point or both ends of the first semiconductor switch element and the second semiconductor switch element, the signal line supplying a driving signal to control terminals of the first semiconductor switch element and the second semiconductor switch element, the first control switch being controlled to an OFF state when the bidirectional switch is controlled to an ON state, and being controlled to the ON state when the bidirectional switch is controlled to the OFF state; and
   a second control switch that is connected between the signal line and the middle point or both the ends in parallel with the first control switch, the second control switch being turned on when a potential of the middle point or both the ends becomes a negative potential.

3. The control device for the semiconductor switch according to claim 2, wherein
   the first semiconductor switch element and the second semiconductor switch element include n-channel FETs,
   the first control switch includes a PNP transistor that includes an emitter terminal connected to the signal line, a base terminal connected to a ground via a third control switch, and a collector terminal connected to a source terminal of the first semiconductor switch element and a source terminal of the second semiconductor switch element, and
   the second control switch includes an NPN transistor that includes an emitter terminal connected to the source terminal of the first semiconductor switch element and the source terminal of the second semiconductor switch element, a base terminal connected to the ground, and a collector terminal connected to the signal line.

4. The control device for the semiconductor switch according to claim 2, wherein
   the first semiconductor switch element and the second semiconductor switch element include p-channel FETs,
   the first control switch includes a PNP transistor that includes an emitter terminal connected to a source terminal of the first semiconductor switch element and a source terminal of the second semiconductor switch element, a base terminal connected to a ground via a third control switch, and a collector terminal connected to the signal line, and
   the second control switch includes an NPN transistor that includes an emitter terminal connected to the source terminal of the first semiconductor switch element and the source terminal of the second semiconductor switch element, a base terminal connected to the ground, and a collector terminal connected to the signal line.

5. An electrical power system comprising:
   a power storage that supplies power to a load in a vehicle;
   a bidirectional switch that is connected between the power storage and the load, the bidirectional switch including a first semiconductor switch element and a second semiconductor switch element that are connected in series and in reverse to each other; and
   the control device according to claim 2 that controls the bidirectional switch.

6. The electrical power system according to claim 5, wherein
   a ground of the power storage and a ground of the control device are connected to a chassis of the vehicle in a non-insulated state.

7. An electrical power system comprising:
   a power storage that supplies power to a load in a vehicle;
   a bidirectional switch that is connected between the power storage and the load, the bidirectional switch including a first semiconductor switch element and a second semiconductor switch element that are connected in series and in reverse to each other; and
   the control device according to claim 3 that controls the bidirectional switch.

8. An electrical power system comprising:
   a power storage that supplies power to a load in a vehicle;
   a bidirectional switch that is connected between the power storage and the load, the bidirectional switch including a first semiconductor switch element and a second semiconductor switch element that are connected in series and in reverse to each other; and
   the control device according to claim 4 that controls the bidirectional switch.

9. The electrical power system according to claim 7, wherein
   a ground of the power storage and a ground of the control device are connected to a chassis of the vehicle in a non-insulated state.

10. The electrical power system according to claim 8, wherein
    a ground of the power storage and a ground of the control device are connected to a chassis of the vehicle in a non-insulated state.

* * * * *